United States Patent [19]

Drake et al.

[11] Patent Number: 5,228,666
[45] Date of Patent: Jul. 20, 1993

[54] FIXTURE FOR FABRICATING FULL WIDTH SCANNING OR IMAGING ARRAYS FROM SUBUNITS

[75] Inventors: Donald J. Drake; Almon P. Fisher, both of Rochester, N.Y.

[73] Assignee: Xerox Corporation, Stamford, Conn.

[21] Appl. No.: 797,626

[22] Filed: Nov. 25, 1991

[51] Int. Cl.[5] .............................................. B25B 11/00
[52] U.S. Cl. .................................. 269/21; 269/289 R; 269/319; 269/303
[58] Field of Search ................... 269/21, 289 R, 296, 269/303, 305, 315, 319

[56] References Cited

U.S. PATENT DOCUMENTS

| | | | |
|---|---|---|---|
| 3,359,879 | 12/1967 | Hamlin | 269/21 |
| 3,453,957 | 7/1969 | Hamilton | 269/21 |
| 3,681,139 | 8/1972 | Jannett et al. | 269/21 |
| 3,851,758 | 12/1974 | Makhijani et al. | 269/21 |
| 4,690,391 | 9/1987 | Stoffel et al. | 269/21 |
| 4,712,018 | 12/1987 | Stoffel et al. | 250/578 |
| 4,735,671 | 4/1988 | Stoffel et al. | 156/304.3 |
| 4,928,936 | 5/1990 | Ohkubo et al. | 269/21 |
| 4,999,077 | 3/1991 | Drake et al. | 156/299 |
| 5,067,695 | 11/1991 | Huddleston | 269/296 |

FOREIGN PATENT DOCUMENTS 2168915  7/1986  United Kingdom .................. 269/21

Primary Examiner—Bruce M. Kisliuk
Assistant Examiner—Eileen P. Morgan
Attorney, Agent, or Firm—Robert A. Chittum

[57] ABSTRACT

A fixture for fabricating a full width scanning or imaging array from a plurality of relatively short subunits which provides immunity from vertical misalignment of the subunits caused by particle contamination. This is accomplished by providing a clearance slot in the fixture horizontal reference edge to minimize the reference edge and subunit contact area and to provide a space for the contaminating particles to accumulate so that they will not interfere with the precision placement and vertical alignment of the subunits on the fixture.

8 Claims, 5 Drawing Sheets

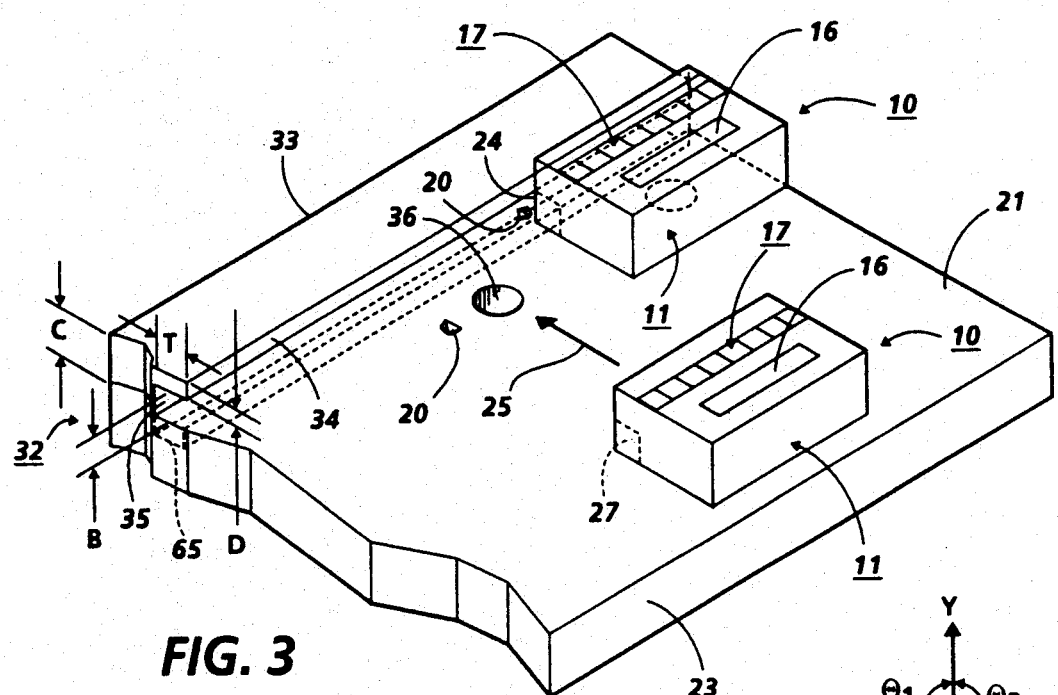
FIG. 3
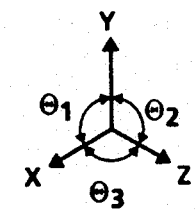
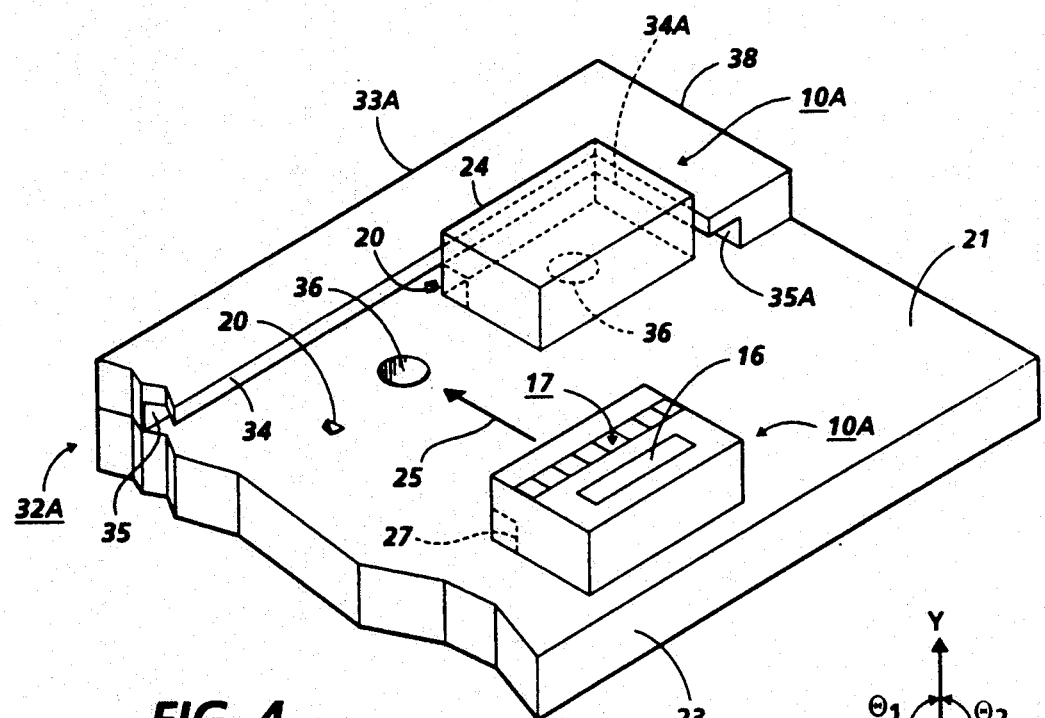
FIG. 4
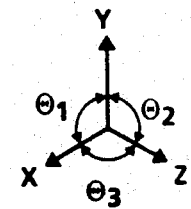

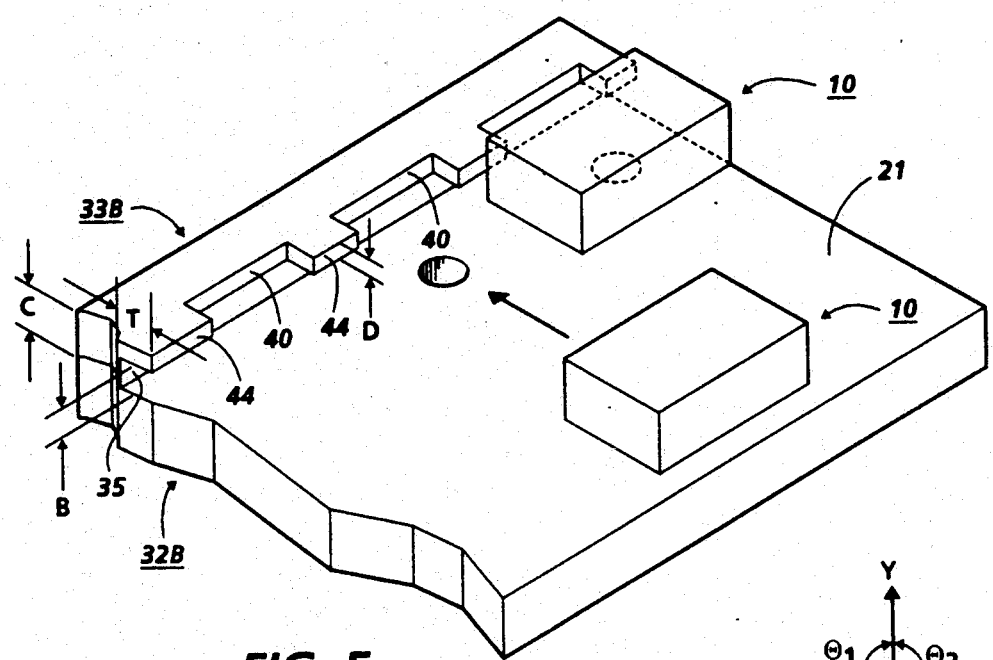
FIG. 5
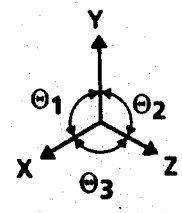
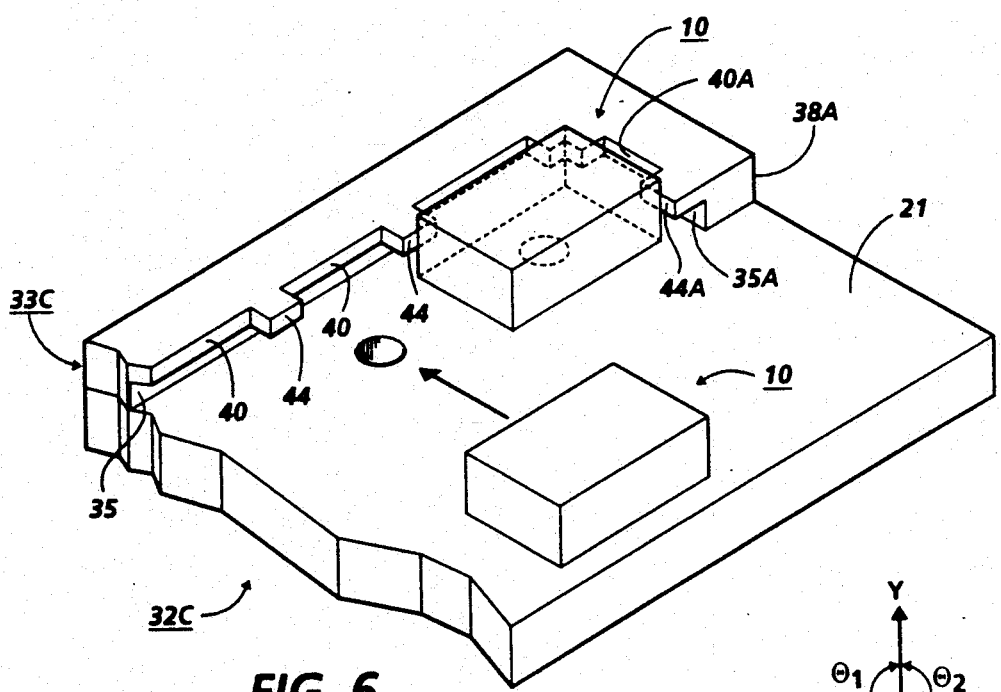
FIG. 6
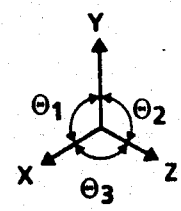

FIXTURE FOR FABRICATING FULL WIDTH SCANNING OR IMAGING ARRAYS FROM SUBUNITS

BACKGROUND OF THE INVENTION

This invention relates to abutting assembly of full width scanning or imaging arrays from subunits, and more particularly to a fixture which provides immunity from misalignment of subunits abuttingly assembled thereon to produce a full width array even with the presence of contaminating particles.

Cross-reference is made to co-pending, commonly assigned U.S. application Ser. No. 07/742,802, filed Aug. 9, 1991, by the same inventors, and reference is made to FIGS. 8A and 8B discussed on pages 19, beginning at line 37 through page 21, line 8, which portion of the application is hereby incorporated by reference.

It is well known in the raster scanning industry to assemble pagewidth raster input scanning (RIS) and raster output scanning (ROS) bars from relatively short RIS/ROS subunits placed end-to-end. Once assembled, the pagewidth RIS/ROS bars or scanning arrays have the requisite length and number of image processing elements to scan an entire line of information at once with a high image resolution. The subunits have either image reading arrays which comprise a succession of image sensing elements to convert the image line into electrical signals or pixels or image writing arrays which comprise a succession of light producing or other elements employed to produce images in response to an image signal or pixel input, such as for example, ink jet printheads.

In the precision aligning of semiconductor die for various input and output full width scanner or printing arrays from subunits, it is generally important to align the die both in the horizontal direction of the array of die or X-axis and also in the vertical or perpendicular direction relative to the direction of the die or Y-direction. The Z-direction is the direction of the width of the full width arrays while the X-direction refers to the length of such arrays. The prior art has failed to provide a convenient means for fabricating a pagewidth scanning or imaging array from subunits, which has adequate precise alignment tolerances in the XY and θ space. Precision alignment in the Y-direction is usually done by butting the die against a reference straight edge. It is relatively easy to acquire high precision reference straight edges for alignment fixtures. In an absolutely clean environment, precision die alignment is easy to achieve. However, most environments, including expensive class 100 clean rooms, are not absolutely clean. In addition, the semiconductor die are often contaminated in transit from the semiconductor processing area to the packaging area where assembly of the pagewidth arrays from subunits occur. For these reasons, it is important to minimize the effect of contamination on the die while being aligned and assembled on an assembly fixture.

U.S. Pat. Nos. 4,690,391; 4,712,018; and 4,735,671 to Stoffel et al. disclose a method for fabricating long, full width scanning arrays. Smaller arrays are assembled in abutting end-to-end relationship by an aligning tool having predisposed pin-like projections insertable in locating grooves in a surface of the smaller arrays. Vacuum ports in the aligning tool surface draw the smaller units into tight face-to-face contact with the tool. A suitable base is then affixed to the aligned small arrays and the aligning tool withdrawn, leaving a full width scanning array composed of a row of an end-to-end abutted smaller rays.

U.S. Pat. No. 4,999,077 to Drake et al. discloses a method for fabricating a co-planar full width scanning array from a plurality of relatively short scanning subunits for reading and writing images. The subunits are fixedly mounted in an end-to-end relationship on a flat structural member with the subunit surface containing the scanning elements all being co-planar even though at least some of the subunits have varying thicknesses. This is accomplished by forming, from a photopatternable thick film layer, one or more kegs on the subunit surface having the scanning elements and associated circuitry and positioning the keys into keyways produced from a photopatternable thick film layer on a flat surface of an alignment fixture. A conformal adhesive bonds a structural member to the assembled subunits to form a full width scanning array.

SUMMARY OF THE INVENTION

It is an object of the present invention to provide a fixture for fabricating full width scanning or imaging arrays from subunits which prevents misalignment caused by particle contamination.

It is another object of this invention to provide a fixture for fabrication of full width scanning and imaging arrays from subunits which provides a minimized reference edged to subunit contact area, thereby preventing misalignment by the presence of contaminating particles.

In the present invention, a fixture for positioning a predetermined number of relatively short subunits of scanning or imaging arrays in precise end-to-end abutment relationship with each other to provide a composite full width array which prevents misalignment of the subunits caused by particle contamination is disclosed. The fixture comprises a base having at least one substantially flat surface and an elongated bar fixedly mounted on the base. The bar has at least one substantially flat surface perpendicular to the base surface and has a slot therein which extends the length of the bar to thereby form a reference edge for alignment of the subunits there against. The slot is adjacent the base surface to form a recess for receipt and accumulation of any contaminated particles, thereby preventing any contaminating particles from causing misalignment of the subunits. The fixture may have a plurality of vacuum ports in the base for releasably drawing and locking the subunits into tight contact with the base when the subunits are placed thereon in contact with the reference edge. In an alternate embodiment, notches are placed in the reference edge to further minimize the contact area between the reference edge and the subunits, thereby further reducing the chances of misalignment in the fixture by particle contamination.

A more complete understanding of the present invention can be obtained by considering the following detailed description in conjunction with the accompanying drawings wherein like parts have the same index numerals.

BRIEF DESCRIPTION OF THE DRAWINGS

FIG. 3 is a schematic isometric view of an alignment fixture for assembly of subunits incorporating the present invention.

FIG. 4 is a schematic isometric view of an alignment fixture for assembly of subunits incorporating an alternate embodiment of the present invention.

FIG. 5 is a schematic view of the alignment fixture for assembly of subunits incorporating another embodiment of the present invention.

FIG. 6 is a schematic isometric view of the alignment fixture for assembly of subunits incorporating still another embodiment of the present invention.

DESCRIPTION OF THE PREFERRED EMBODIMENT

Figure 1:
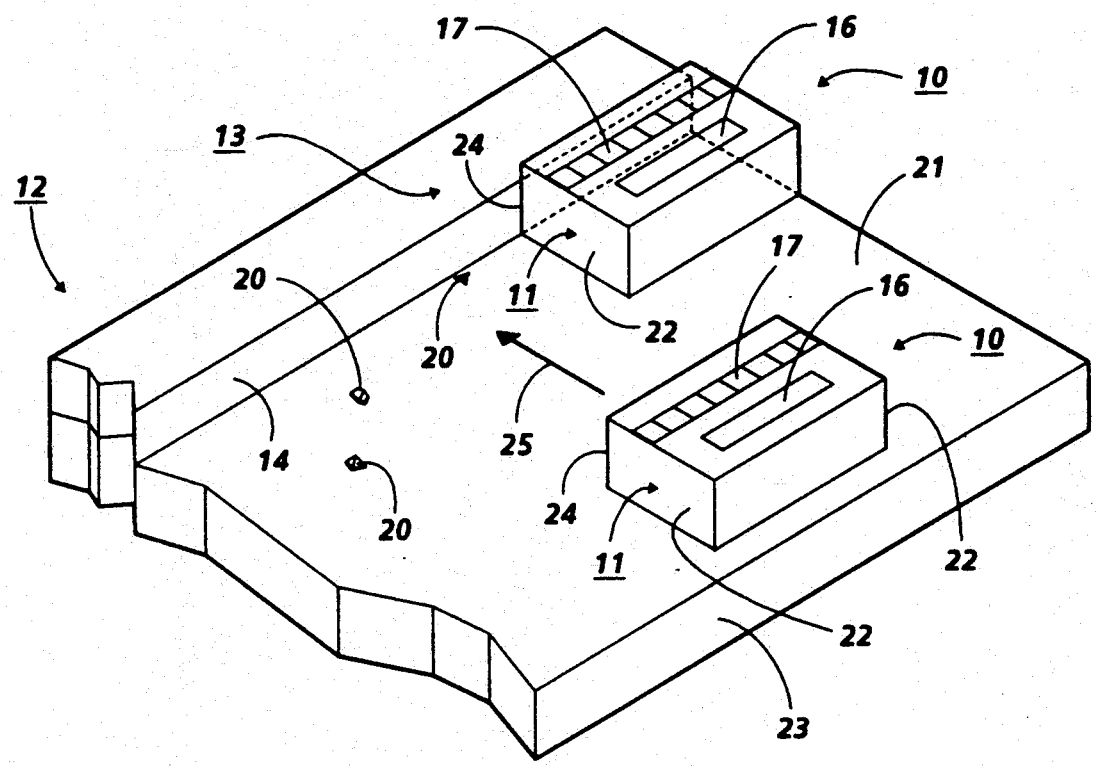
FIG. 1 is schematic isometric view of a typical alignment fixture for assembly of subunits.

In FIG. 1, a plurality of scanning sensor array chips or subunits 10 are schematically shown being assembled, one at a time, in a typical alignment fixture 12, of the type well know in the industry. For illustration purposes, only two subunits are shown, though many are generally required to form a pagewidth array capable of scanning or imaging a document having, for example, a width of ½ inches since such subunits generally have a length in the range of 0.25 to 1 inch. A plurality of subunits may form a composite full width scanning array by aligning them in an end-to-end relationship on fixture 12 with side edge 24 placed against reference edge 14 of the fixture 12. For ease of discussion, the fixture and subunits are oriented in the illustrated X, Y, Z and angular direction $\theta$, as shown in the drawings. The length of the scanning or imaging array 17 on each subunit is in the X-direction, so that the scanning or imaging direction is in the Z-direction. The side edge 24 of subunit 10 lies in the XY plane, thus the thickness or height of the subunit is in the Y-direction.

The composite full width scanning array may be formed from either a series of image read arrays (i.e. charge coupled devices, photodiodes, etc.) to provide a composite read array for scanning document originals and converting the document image to electrical signals or pixels, or a series of image write arrays (i.e. light emitting diodes, laser diodes, magnetic heads, or other printheads such as ink jet printheads) to provide a composite write array for writing images on a suitable imaging member or recording medium, such as, for example, a photoconductor for a xerographic copying system or paper for an ink jet printer in accordance with an image signal or pixel input.

The individual scanning array subunits may be obtained for example by dicing a silicon wafer having a plurality of sets or linear arrays of scanning, imaging, or sensing elements 17 and associated control circuitry 16 formed thereon. By dicing along mutually perpendicular lines, a plurality of individual subunits may be formed with very close dimensional tolerances quite suitable for abutment with each other.

A typical scanning array subunit 10 includes a generally rectangular base 11, which is preferably silicon and obtained by dicing the wafer as discussed earlier. Each subunit 10 has a plurality of sensors 18 arranged in a linear row or array 17 in one surface 19 thereof. Sensor row 17 is parallel to side edge 24 of the subunit base 11. Cooperating control circuitry 16, which may include logic gate and a shift register (not shown), can also be integrated onto the subunit base 11 for controlling operation of the sensors or scanning elements 18. Sensors or scanning elements 18 may, for example, comprise photodiodes adapted to convert image rays impinging thereon to electrical signals or pixels in the case of a read array or LED's selectively operated in response to an image signal input to produce image rays corresponding to the image represented by the image signals for exposing an imaging member (not shown) or for pulsing bubble generating resistors in a thermal ink jet printer (not shown) to permit scanning array subunit 10 to be joined in abutting relation with other like subunits, a row 17 of scanning elements or sensors 18 extend to opposite ends 22 of the base 11.

Figure 2:
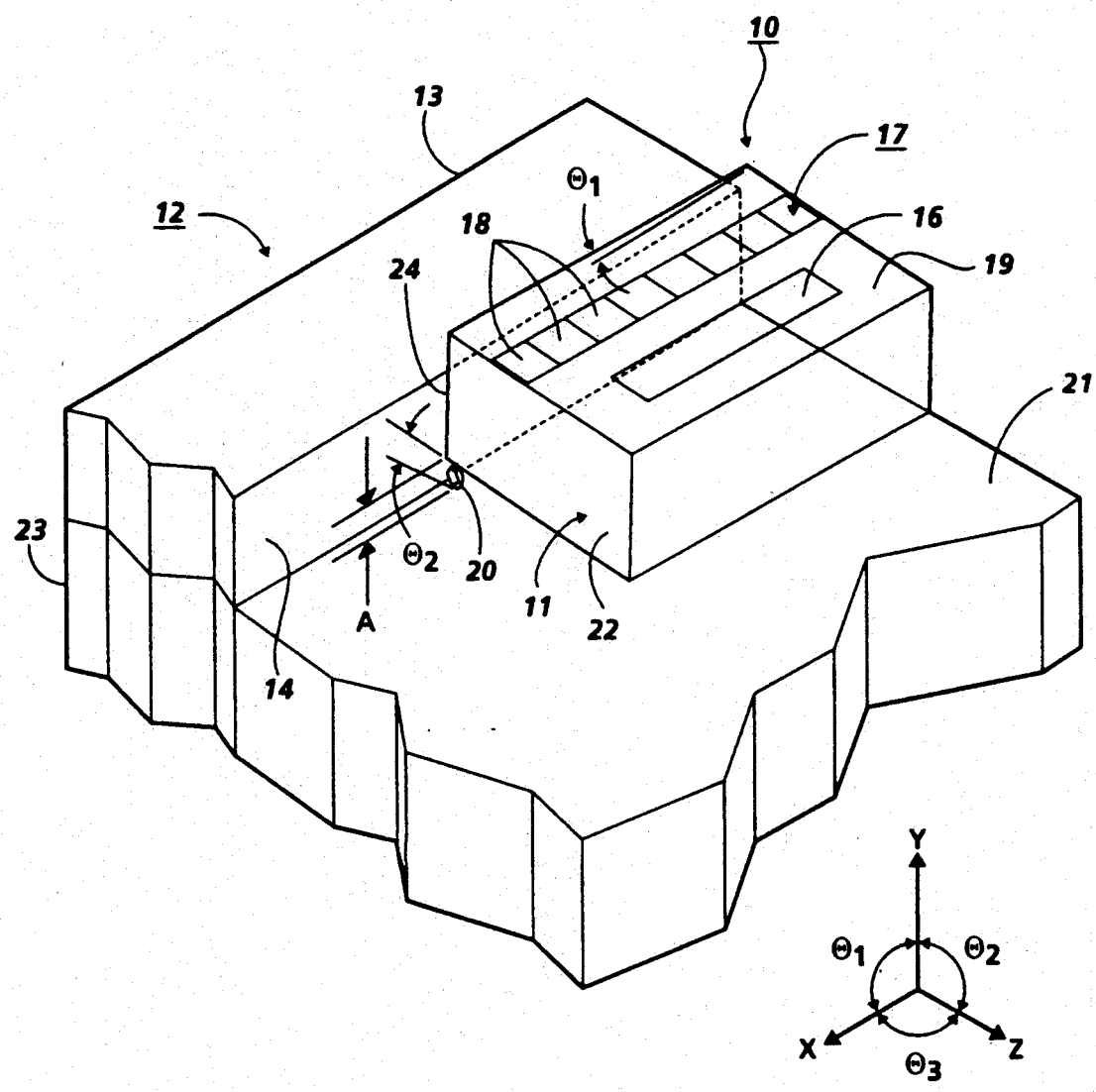
FIG. 2 is an enlarged, partially shown isometric view of the typical alignment fixture of FIG. 1 showing misalignment of a subunit because of particle contamination.

Referring to FIGS. 1 and 2, where FIG. 2 is an enlarged, partially shown view of FIG. 1, prior art alignment fixture 12 has a base 23 and a bar 13 which may be an integral part of the base or fixedly mounted thereon. The base has a surface 21 and the bar has a reference edge 14 which are accurately machined to provide highly accurate mutually perpendicular surfaces for the end-to-end abutment of scanning array subunits 10, placed one at a time thereon. The scanning or imaging array 17 of elements 18 are parallel to the fixture reference edge 14, when the subunit side edge 24 is placed in intimate contact with the fixture reference edge, thereby being capable in a perfectly clean environment of producing precision alignment in the X-direction. It is relatively easy to acquire high precision reference straight edges, so that in a substantially clean environment, precision subunit alignment is easy to achieve, as is well known in the art. However, most environments, including expensive class 100 clean rooms, are not absolutely clean. Silicon subunits are often contaminated in transit from the semiconductor processing area to the assembly and packaging area. Contaminating particles either settle on the fixture 12 from the assembly environment or they are transported there on the subunits themselves. As the subunits are placed on the fixture base surface 21 and guided into position against the reference edge 14, as indicated by arrow 25, contaminating particles 20 are accumulated at the corner between the reference edge 14 and base surface 21 and cause the subunit to be misaligned by the dimension A in the Y-direction as well as angular misplacement in the XY and YZ planes as schematically shown in FIG. 2 and identified as angles $\theta_1$ and $\theta_2$, respectively. If the particle 20 is caught between the subunit side edge 24 and the fixture reference edge 14, the misalignment (not shown) would be in the Z direction in the XY plane with the angular misalignment $\theta_3$ (not shown) being in the XZ plane.

FIG. 3, a view similar to FIG. 1, shows the alignment fixture 32 of the present invention, which comprises a base 23 having accurately machined surface 21 and an elongated alignment bar 33 having reference surface 34 with slot 35 therein. The scanning or imaging subunits 10 are placed on the fixture base surface 21 and guided into contact with the reference edge 34 as done with the prior art fixture, but the clearance slot 35 provides two important advantages; namely, a recess for accumulation of contaminating particles 20 and a minimized contact area between the reference edge 34 and side edge 24 to substantially eliminate the problem of contaminating particles being trapped between the alignment bar 33 and the subunit side edge 24 which causes misalignment in the Z-direction. These advantages over the prior art alignment fixtures provide immunity against misalignment caused by contaminating particles. Vacuum ports 36 are optionally provided in the fixture base with a vacuum source (not shown) connected thereto for releasably drawing and locking the subunits into tight contact with the fixture base, as the subunits are guided, as shown by arrow 25, into contact with the fixture reference edge and into end-to-end abutment with the other subunits assembled on the fixture 32.

An alternate embodiment of the alignment fixture is shown in FIG. 4. The alignment fixture 32A is substantially the same as that shown in FIG. 3, except that the elongated alignment bar 33A has an extension 38 at a right angle to the alignment bar, and the bar extension also has slot 35A identical with the alignment bar slot 35. The extension provides for accurate placement of the first subunit and the full width scanning or imaging array. For increased immunity from misalignment because of contaminating particles, the subunit side edge 24 of the subunits may optionally have a recess 27 (shown in dashed line), so that, when assembled on the fixture, the fixture slots 35, 35A and subunit recess 27 provide an enlarged volume or cavity for the movement into and accumulation of contaminating particles, as the subunits are assembled on the fixture.

FIG. 5 shows another embodiment of the alignment fixture of FIG. 3. In this embodiment, notches 40 are provided in the reference edge 44 of the elongated alignment bar 33B for further reduction in the contact area between the subunit side edge and reference edge 44. The notches having a depth of about 40 micrometers and a length sufficient to enable at least two contact areas per subunit. In the preferred embodiment of the assembly fixture, the geometrical dimensions of the alignment bar and slot are determined by the size of the subunits used to form the full width array. For a subunit length of one centimeter, the length being in the X direction or the direction of the scanning or imaging array 17, the notch lengths are such that the contact length of the reference edge 44 is about 10 mils or 250 micrometers. Therefore, if the slot height "B" is 10 mils or 250 micrometers and the bar height "C" is 20 mils or 500 micrometers, then each contact area is 250 micrometer square. For subunits produced from 20 mils thick wafers, the upper corners of the subunit side edge 24 will be contacted thereby. The height of bar 33 and the slot 35 therein are selectively determined to locate the contact area on the subunits as desired. The embodiment in FIG. 4 is altered in a manner similar to that in FIG. 5 and shown in FIG. 6 as still another embodiment of the alignment fixture of the present invention. Thus, elongated alignment bar 33C has extension 38A. Slot 35 in the bar and slot 35A the extension have the identical height "B" and depth "T" to form the reference edges 44, 44A for placement of the subunits thereagainst. Depth T for the subunit size mentioned above is in the range of 0.1 to 10 μms. the thickness of the alignment bar reference edge 34 in FIG. 3 or 44 in FIG. 5 may vary from substantially a knife edge to any desired thickness, but preferably varies from 25 to 250 μm. Notches 40 limit the contact areas between the subunits and the reference edges in the same manner as described above with respect to FIG. 5.

Figure 7:
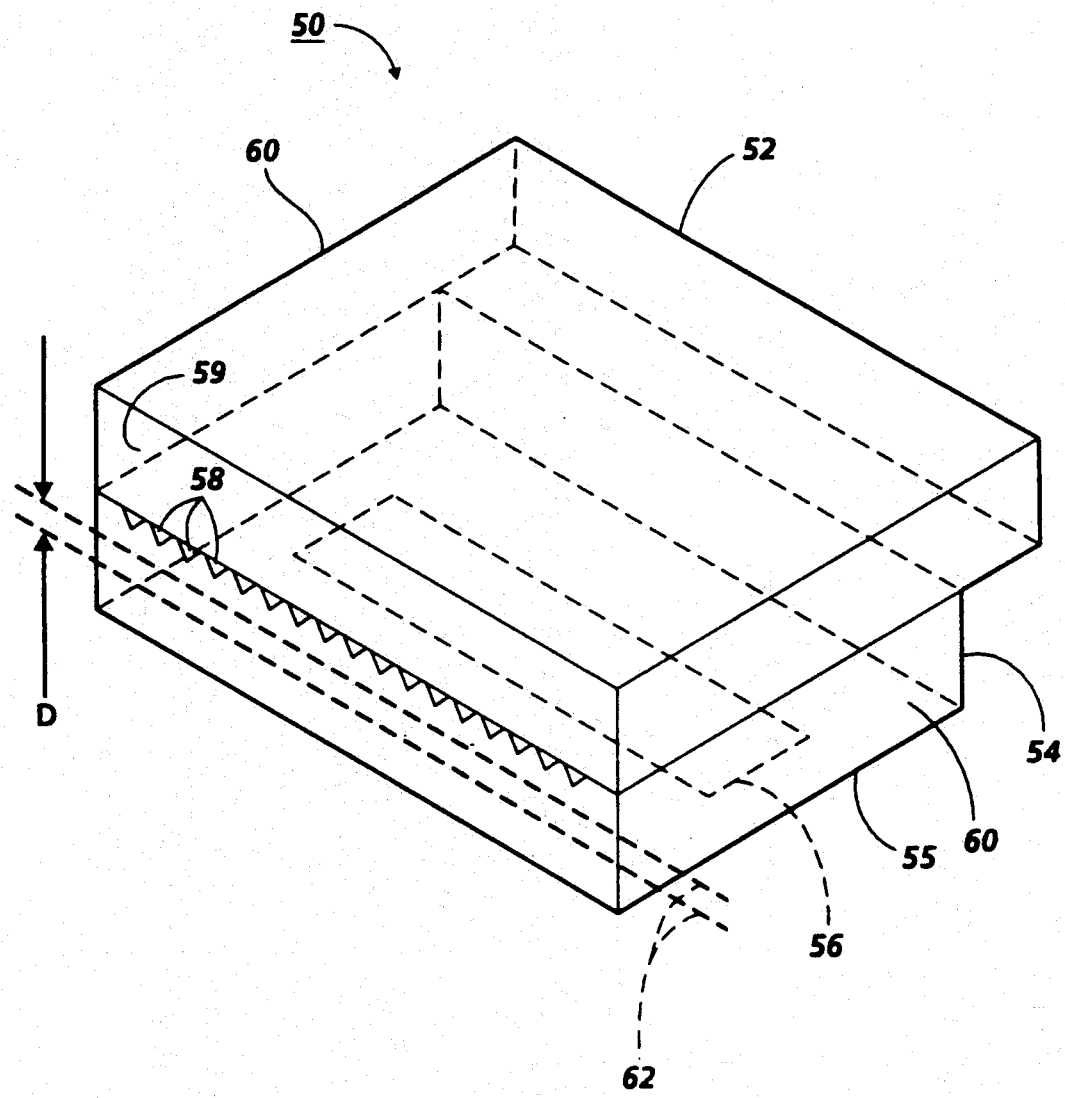
FIG. 7 is a schematic isometric of a thermal ink jet printhead subunit.

The alignment fixtures of FIG. 3-6 may be used to assemble thermal ink jet printhead subunits 50, as shown in FIG. 7, to fabricate pagewidth printheads. Typically, such printhead subunits have a heater plate 52 aligned and bonded to a channel plate 54. The heater plate has a linear array of heating elements and addressing electrodes or driver circuitry (not shown), and the channel plate has an etched inlet 56 (shown in dashed line), reservoir (not shown), nozzles 58 and a parallel set of channels (not shown) placing the nozzle into communication with the reservoir. For a more detailed description of a thermal ink jet printhead subunit, refer to U.S. Pat. Nos. 4,774,530; 4,551,371; or 4,829,324. When the printhead subunits are assembled into a full width array on the alignment fixtures of FIGS. 3-6, the subunits are placed on the fixture base 21 with the fill hole containing side 55 of the channel plates in contact with the fixture base surface 21, so that the bottom of the heater plates face upward. The nozzle containing surface 59 of each printhead subunit 50 is then abutted against a fixture reference edge represented as dashed lines 62 with end surfaces 60 contacting each other. The reference edge is at a protrusion formed by placing slot 35 in the alignment bar 33 of the alignment fixtures. The alignment bar on fixture base 21 may be any material such as stainless steel or silicon. The reference edges of fixtures 32 with the slots 35 form a protrusion which defines an elevated, reduced vertical length abutting surface for contacting the printhead subunits and shown in FIG. 7 as dashed lines 62. A reduced vertical length D of the protrusion minimizes vertical standoff between each printhead subunit and the bar reference edge. The elevated position of the protrusion permits dirt and other contaminating particles or debris to collect thereunder, where it will not interfere with the abutting operation. The reduced vertical length of the protrusion also serves to reduce the abutting area, where dirt and debris cannot interfere. A fixture for the assembly of thermal ink jet printhead subunits into pagewidth printbars have a height of the reference edge of about 15 mils and thus, is less than the channel plate thickness. Accordingly, the individual nozzles can be viewed over the reference edge when the printhead subunits are abutted against the reference edge.

In another embodiment, a trench 65, shown in dashed line in FIG. 3 could be added in the surface 21 of the alignment fixture base 23 adjacent and in alignment with the slot 35 to increase further the space for the accumulation of contaminating particles 20. This trench 65 could be, of course, added to any of the other embodiments shown in FIGS. 4 to 6. Another advantage of the trench 65 is that it would permit the depth T of the slot 35 to be much smaller, since the contaminating particles 20 would drop therein as the subunits are moved against the alignment bar reference edge and the particles are shoved ahead of the subunit. The slot depth would have to be appropriate, however, to accommodate any particle retained on the subunit side edge 24 to prevent misalignment in the Z direction.

Accordingly, many modifications and variations are apparent from the foregoing description of the invention and all such modifications and variations are intended to be within the scope of the present invention.

We claim:

1. A fixture for positioning a predetermined number of relatively short subunits of scanning or imaging arrays in precise end-to-end abutment relationship with each other to provide a composite, full width array, comprising:

a base having at least one substantially flat surface;

an elongated bar fixedly mounted on the base and having at least one substantially flat surface adjacent and perpendicular to said base surface, the bar surface having a predetermined height above the base surface and a slot therein having a predetermined height above the base surface shorter than said bar surface height which extends the length of the bar and thereby reduces the bar surface to a reference edge spaced above the base surface for alignment of the subunits thereagainst, the slot being parallel to and adjacent the base surface to form a recess in the bar surface for receipt and accumulation of any contaminating particles, thereby preventing said contaminating particles from causing vertical misalignment of the subunits.

2. The fixture of claim 1, wherein the elongated bar of said fixture has an extension at one end thereof, the bar extension having at least one substantially flat surface adjacent and perpendicular to said base surface and perpendicular to the bar surface, the extension surface having the same height as the bar surface and a slot therein identical to the slot in the bar surface and aligned therewith, the slot in the extension surface reducing the extension surface to a reference edge spaced above the base surface for alignment of a first subunit against both reference edges.

3. The fixture of claim 2, wherein the reference edge of the bar and the bar extension reference edge have notches therein of predetermined length to provide a minimized contact area between the reference edges and the subunits, the length of each notch in the reference edges providing at least two contact locations for each subunit.

4. The fixture of claim 3, further comprising a plurality of vacuum ports in said base and means for applying a vacuum to said ports for releasably drawing and locking said subunits into tight contact with said base when said subunits are placed thereon in contact with bar reference edge.

5. The fixture of claim 1, wherein the reference edge of the elongated bar has notches therein of predetermined length to provide a minimized contact area between the reference edge and the subunits, the notches being located to permit at least two contact points with each subunit.

6. The fixture of claim 1, wherein the base surface has a trench therein parallel to and adjacent and the slot in the bar surface to provide an enlarged space for accommodating contaminating particles moved therein by the assembly of subunits on the fixture.

7. The fixture of claim 1, wherein the elongated bar has notches therein of predetermined length to provide a minimized contact area between the reference edge and the subunits, the notches being located to permit at least two contact points with each subunit; wherein the base surface has a trench therein parallel to and adjacent the slot in the bar surface to provide an enlarged space for accommodating contaminating particles moved therein by the assembly of subunits on the fixture; and wherein the fixture further comprises a plurality of vacuum ports in said base and means for applying a vacuum to said ports for releasably drawing and locking said subunits into tight contact with said base when said subunits are placed thereon in contact with bar reference edge.

8. The fixture of claim 7, wherein the elongated bar of said fixture has an extension at one end thereof, the bar extension having at least one substantially flat surface adjacent and perpendicular to said base surface and perpendicular to the bar surface, the extension surface having the same height as the bar surface and a slot therein identical to the slot in the bar surface and aligned therewith, the slot in the extension surface reducing the extension surface to a reference edge spaced above the base surface for alignment of a first subunit against both reference edges.

* * * * *